(12) United States Patent
Simon

(10) Patent No.: US 6,591,625 B1
(45) Date of Patent: Jul. 15, 2003

(54) COOLING OF SUBSTRATE-SUPPORTED HEAT-GENERATING COMPONENTS

(75) Inventor: Jonathan Simon, Castro Valley, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/124,300

(22) Filed: Apr. 17, 2002

(51) Int. Cl.[7] .............................. F25D 23/12; H05K 7/20
(52) U.S. Cl. ................. 62/259.2; 165/104.33; 361/689; 361/699
(58) Field of Search .............................. 62/259.2, 401; 165/104.33; 361/699, 717, 718, 689, 688; 257/713, 714

(56) References Cited

U.S. PATENT DOCUMENTS

| | | |
|---|---|---|
| 4,938,742 A | 7/1990 | Smits |
| 5,218,515 A | 6/1993 | Bernhardt |
| 5,522,452 A * | 6/1996 | Mizuno et al. ........ 165/104.33 |
| 5,759,015 A | 6/1998 | Van Lintel et al. |
| 5,801,442 A | 9/1998 | Hamilton et al. |
| 5,932,940 A | 8/1999 | Epstein et al. |

OTHER PUBLICATIONS

Microchannel Cooling of Face Down Bonded Chips, PCT/US93/01928.

* cited by examiner

Primary Examiner—Chen Wen Jiang

(57) ABSTRACT

Systems for cooling heat-generating components are provided. A representative embodiment of such a system includes a heat-generating component supported by a substrate. A microcompressor supported by the substrate compresses a cooling fluid. A heat exchanger supported by the substrate receives cooling fluid from the microcompressor and removes heat from the cooling fluid. A microexpander is thermally coupled to the heat-generating component and receives and expands the cooling fluid to remove heat from the heat-generating component. Methods and other systems also are provided.

20 Claims, 2 Drawing Sheets

COOLING OF SUBSTRATE-SUPPORTED HEAT-GENERATING COMPONENTS

FIELD OF THE INVENTION

The present invention generally relates to electronics. In particular, the invention relates to systems and methods for cooling substrate-supported heat-generating components of electronic devices.

DESCRIPTION OF RELATED ART

There is a continuing demand for electronic devices to be made smaller and to operate faster and at higher levels of power. However, the reliability of small, fast-operating, high-power electronic devices oftentimes is limited by the heat produced by such devices. More specifically, the performance of an electronic device can be hindered if excess heat is not removed.

By way of example, excess heat can cause components of an electronic device to develop cracks. Typically, these cracks are caused by differences in the thermal coefficients of expansion of materials used in the components. Of particular interest, cracks can produce electrical discontinuities, such as by separating leads, and/or can result in mechanical failure of a substrate upon which another component is mounted. Additionally, excess heat can affect electrical properties, e.g., resistance, of electrical components.

In order to remove excess heat from an electronic device, some packaging techniques rely on conductive transport of heat to an internal heat sink of the device. As is known, such a technique oftentimes is inadequate for dissipating large, localized heat fluxes that can be associated with electronic components.

Based on the foregoing, there is a need for improved systems and methods that address these and/or other perceived shortcomings of the prior art.

SUMMARY OF THE INVENTION

The present invention involves cooling of heat-generating components that are supported by substrates. In particular, the invention involves compressing a cooling fluid within a substrate and then expanding the cooling fluid to remove heat from components that are thermally coupled to the cooling fluid. By removing heat from a substrate and/or heat-generating components supported by the substrate, the tendency of an electronic device to exhibit heat-related failures is reduced.

A system in accordance with the invention includes a substrate and a heat-generating component supported by the substrate. The substrate supports a microcompressor that compresses a cooling fluid. A heat exchanger is supported by the substrate, receives cooling fluid from the microcompressor, and removes heat from the cooling fluid. A microexpander is arranged at least partially in the substrate and receives cooling fluid from the heat exchanger. The microexpander expands the cooling fluid and thermally couples the cooling fluid to the heat-generating component so that heat is removed from the heat-generating component.

Micromachined components can be used to facilitate cooling. For instance, micromachined compression stages of a microcompressor and/or micromachined expansion stages of a microexpander can be supported by, e.g., formed at least partially in, a substrate.

Based upon the requirements of the particular application, a microexpander can be sized and/or shaped for routing cooling fluid in various manners. For instance, the microexpander can be a serpentine-shaped structure that routes cooling fluid to multiple locations about a substrate.

Various cooling fluids can be used. For instance, a gas, such as air or nitrogen, or a liquid, such as water or liquid nitrogen, can be used depending upon the particular application. Note, a phase-change medium that changes state from a liquid to a gas and vice versa can be used.

A method in accordance with the invention for cooling a heat-generating component that is supported by a substrate includes compressing a cooling fluid within the substrate. The cooling fluid then is expanded to remove heat from the heat-generating component.

Clearly, some embodiments of the invention may not exhibit one or more of the advantages and/or properties set forth above. Additionally, other systems, methods, features and/or advantages of the present invention will be or may become apparent to one with skill in the art upon examination of the following drawings and detailed description. It is intended that all such additional systems, methods, features and/or advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

As will be described in greater detail here, systems and methods in accordance with the present invention involve cooling of heat-generating components that are supported by substrates. In this regard, the invention may be particularly applicable for use with electronic devices that use heat-generating components, such as integrated circuits and optoelectronic components. For instance, the small size, fast-operating speeds, and relatively high power of an integrated circuit can result in point heat-loading of a substrate that is used to support the integrated circuit. Thus, by using cooling systems and/or methods in accordance with the invention, the tendency of an integrated circuit to generate point heat loads is reduced.

Figure 1:
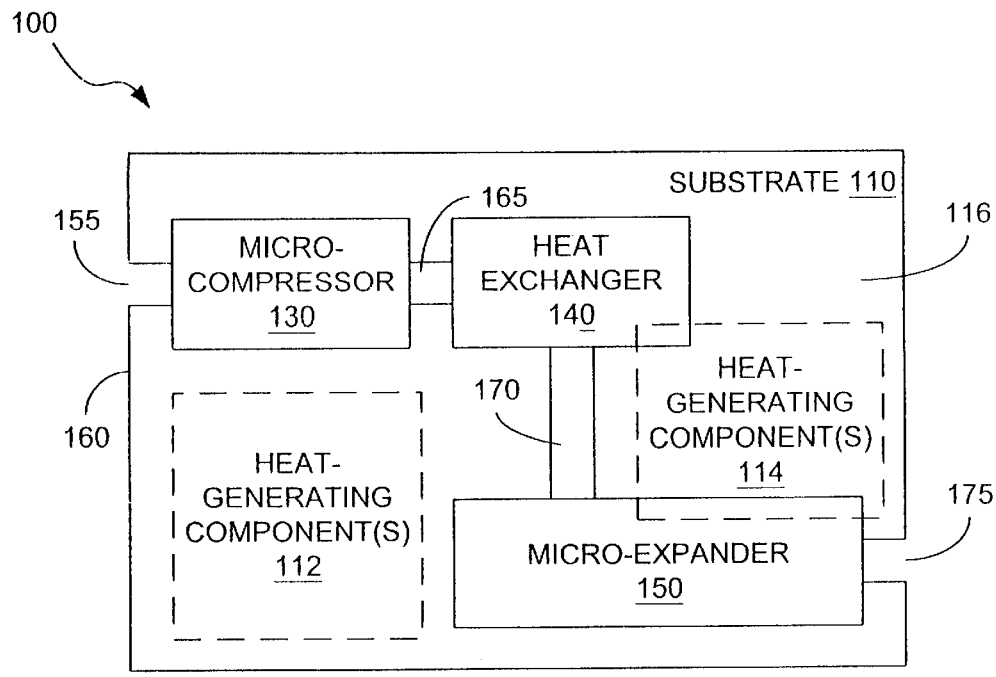
FIG. 1 is a schematic diagram depicting an embodiment of a system in accordance with the present invention.

Referring now to the drawings, FIG. 1 schematically depicts an embodiment of a system 100 in accordance with the invention. As shown in FIG. 1, system 100 includes a substrate 110. Substrate 110 supports heat-generating components 112 and 114, which, in FIG. 1, are mounted to an exterior surface 116 of the substrate. Substrate 110 also supports a microcompressor 130, a micro-heat exchanger 140 and a microexpander 150. The prefix "micro" is used here to refer to a size that is small enough to be arranged on a single substrate, e.g., a single die cut from a semiconductor wafer. Although substrates may be formed in a variety of sizes, they are typically quite small, e.g., on the order of millimeters in size. Thus, the microcompressor, micro-heat exchanger and microexpander each typically can range in size from several millimeters to the scale of a nanometer depending upon the particular application. For instance, the microcompressor, micro-heat exchanger and/or microexpander can be microelectro-mechanical systems (MEMS devices) or nanoelectromechanical systems (NEMS devices).

Substrate 110 defines a cooling fluid inlet 155 that routes cooling fluid from the exterior of the substrate to the microcompressor. In FIG. 1, cooling fluid inlet 155 is formed through the sidewall 160 of the substrate.

A channel 165 routes cooling fluid from the microcompressor 130 to the micro-heat exchanger 140. Micro-heat exchanger 140 removes heat from the cooling fluid after the cooling fluid is compressed by the microcompressor.

A channel 170 routes cooling fluid from the micro-heat exchanger 140 to the microexpander 150. Microexpander 150 expands the cooling fluid so that the temperature of the cooling fluid is decreased. The microexpander also routes the cooling fluid so that the cooling fluid thermally couples with heat-generating components 112, 114 to remove heat from these components. Additionally, a cooling fluid outlet 175 discharges cooling fluid from the substrate.

In operation, the microcompressor 130 creates a suction that draws cooling fluid inwardly, through the cooling fluid inlet, and toward the microcompressor. The microcompressor then compresses the cooling fluid and provides compressed cooling fluid to the micro-heat exchanger. The micro-heat exchanger cools the compressed cooling fluid and provides the compressed, and now cooled, cooling fluid to the microexpander. The microexpander expands the cooling fluid to further decrease the temperature of the cooling fluid. The microexpander also routes the cooling fluid to extract heat directly from a heat-generating component and/or extract heat indirectly from materials and/or components that are thermally coupled with the heat-generating component. Once heat has been extracted, the cooling fluid then is discharged from the substrate via the cooling fluid outlet. Note, in some embodiments, the cooling fluid inlet and cooling fluid outlet fluidly communicate with each other.

Note, heat may be exchanged with the cooling fluid at various locations of the system in addition to the microexpander. For instance, the cooling fluid may extract heat while being routed through channel 170.

Although the heat-generating components 112 and 114 are attached to an exterior surface of substrate 110 in FIG. 1, various other configurations can be used. For instance, substrate 110 can be formed of a semiconductor material that is suitable for the formation of heat-generating components in and/or on the substrate. Additionally, although depicted in FIG. 1 as being defined by material of the substrate, one or more of the channels, inlets and/or outlets can be formed, at least partially, by a discrete component that is supported by the substrate. For instance, cooling fluid inlet 155 can be a tube that is supported by the substrate.

Various cooling fluids can be used. For instance, a gas, such as air or nitrogen, or a liquid, such as water or liquid nitrogen, can be used depending upon the particular application. Note, in some embodiments, a phase-change medium, which changes state from a liquid to a gas and vice versa, can be used. Clearly, the type of cooling fluid selected would be based on numerous considerations, such as the operating temperature range of the system, the thermal properties of the cooling fluid, and compatibility of the cooling fluid with the materials that the cooling fluid may contact, for example.

Figure 2:
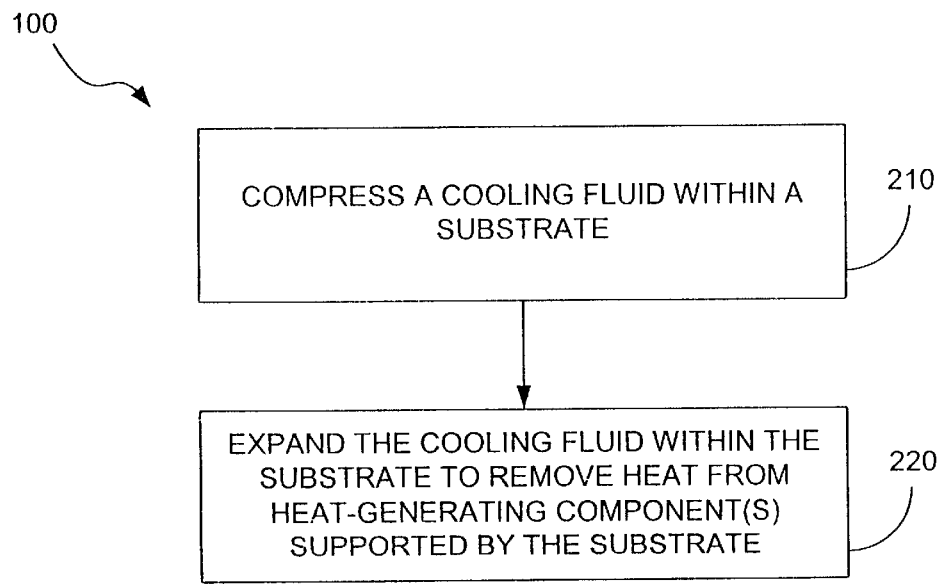
FIG. 2 is a flowchart depicting functionality of the embodiment of FIG. 1.

Referring now to the flowchart of FIG. 2, functionality of the embodiment of the system of FIG. 1 will be described. As shown in FIG. 2, the functionality (or method 100) may be construed as beginning at block 210, where a cooling fluid is compressed within a substrate. In block 220, the cooling fluid is expanded within the substrate to remove heat from one or more heat-generating components that are supported by the substrate.

Figure 3:
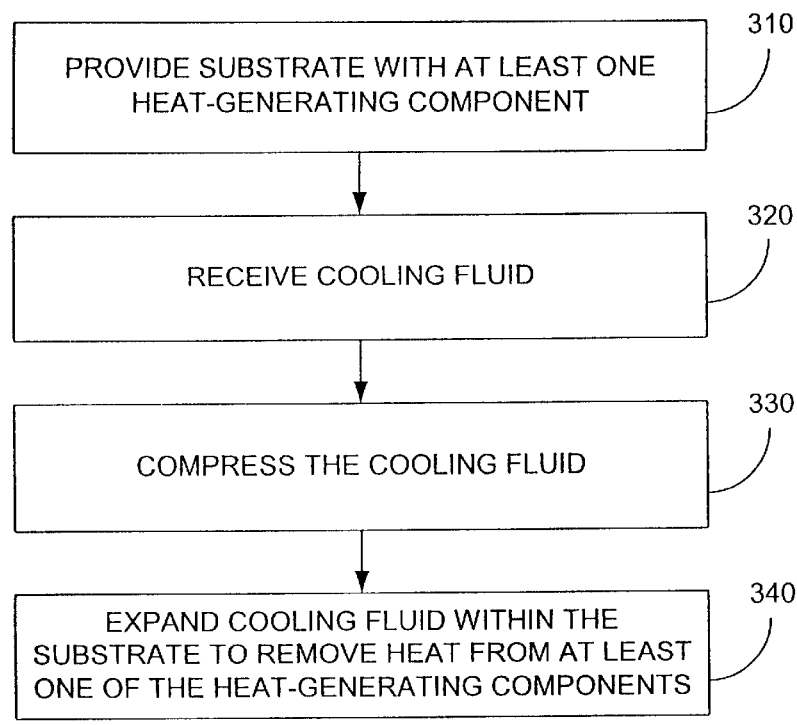
FIG. 3 is a flowchart depicting a functionality that can be associated with the embodiment of FIG. 1.

FIG. 3 is a flowchart depicting functionality of another embodiment in accordance with the present invention. As shown in FIG. 3, the functionality (or method) may be construed as beginning at block 310, where a substrate with at least one heat-generating component is provided. In block 320, cooling fluid is received. In block 330, the cooling fluid is compressed, e.g., compressed within the substrate. Thereafter, such as depicted in block 340, the cooling fluid is expanded so that the cooling fluid can remove heat from at least one of the heat-generating components.

Figure 4:
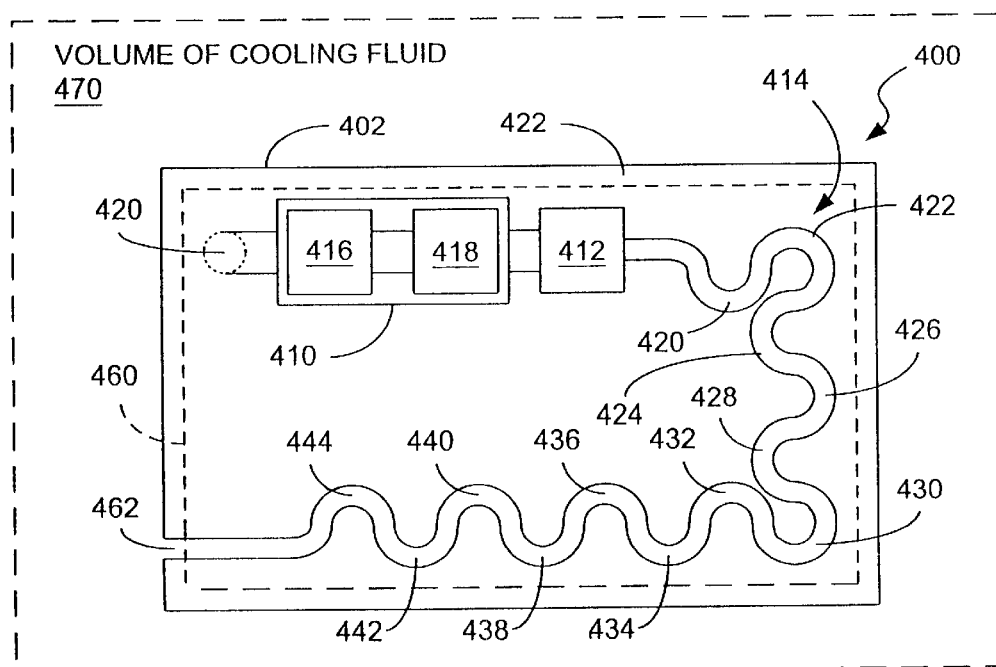
FIG. 4 is another embodiment of a system of the present invention.

FIG. 4 is a schematic diagram of an embodiment of a system in accordance with the invention that can be used to implement the functionality described with respect to FIG. 3. As shown in FIG. 4, system 400 includes a substrate 402 that supports a microcompressor 410, a micro-heat exchanger 412 and a microexpander 414.

Microcompressor 410 incorporates multiple compressor stages, e.g., stages 416 and 418, that receive cooling fluid via a cooling fluid inlet 420. Note, cooling fluid inlet 420 is formed through an exterior face 422 of the substrate and routes cooling fluid from the exterior of the substrate to the microcompressor.

Micro-heat exchanger 412 receives fluid from the microcompressor via a channel 424. Micro-heat exchanger 412 removes heat from cooling fluid after the cooling fluid is compressed by the microcompressor.

Microexpander 414 receives fluid from micro-heat exchanger 412 via a channel 426. Microexpander 414 incorporates multiple expander stages, e.g., stages 430–444, for expanding the cooling fluid. In particular, each of the expander stages exhibits cross-sectional areas that increase with increasing distance from the heat exchanger, as measured along a path traversed by the microexpander. Thus, although not evident in the schematic diagram of FIG. 4, expander stage 444 terminates with a cross-sectional area that is larger than any of the cross-sectional areas exhibited by expander stage 442, for example. This configuration enables the compressed cooling fluid to expand continuously and cool.

In addition to expanding the cooling fluid, the microexpander 414 routes the cooling fluid to thermally couple with heat-generating components that are supported by the substrate. Although no heat-generating components are particularly designated in FIG. 4, one or more heat-generating components can be arranged within area 460, which generally includes the entire substrate. A cooling fluid outlet 462 discharges the cooling fluid from the substrate.

Note, system 400 of FIG. 4 is arranged within a volume 470 of cooling fluid. Cooling fluid inlet 420 and cooling fluid outlet 462 fluidly communicates with the volume 470 of cooling fluid as well as with each other. In some embodiments, the volume of cooling fluid could be the ambient environment, i.e., an open, fluidic system. In other embodiments, the volume of cooling fluid could be a discrete volume of cooling fluid contained by an enclosure formed about the system 400. Thus, the volume of cooling fluid could be attributed to a closed, fluidic system.

Note, a variety of microexpander configurations can be used other than the continuously-expanding configuration depicted in FIG. 4. For example, a microexpander can include multiple segments, one of which may increase in cross-sectional area along its length, while another may maintain a particular cross-sectional area along its length. Such a configuration may enable a cooling fluid to expand and cool in a segment of increasing cross-sectional area that is arranged where heat removal is needed, while enabling transport of the cooling fluid in a segment of non-increasing cross-sectional area where heat removal may not be as necessary. The cooling fluid could then be further expanded and cooled in another segment of increasing cross-sectional area that is arranged where heat removal also is needed.

The foregoing description has been presented for purposes of illustration and description. It is not intended to be exhaustive or to limit the invention to the precise forms disclosed. Modifications or variations are possible in light of the above teachings. The embodiment or embodiments discussed, however, were chosen and described to provide an illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A cooling system comprising:

a substrate;

a heat-generating component supported by the substrate;

a microcompressor supported by the substrate and operative to compress a cooling fluid;

a heat exchanger supported by the substrate and fluidly communicating with the microcompressor, the heat exchanger being operative to receive cooling fluid from the microcompressor and remove heat from the cooling fluid; and a microexpander arranged at least partially in the substrate and fluidly communicating with the heat exchanger, the microexpander being thermally coupled to the heat-generating component and operative to receive and expand the cooling fluid such that heat is removed from the heat-generating component.

2. The system of claim 1, wherein the microexpander is a channel defined by the substrate.

3. The system of claim 2, wherein a cross-sectional area of the channel increases uniformly along a path traversed by the channel.

4. The system of claim 2, wherein a cross-sectional area of the channel increases in size with increasing distance, as measured along a path traversed by the channel, from the heat exchanger.

5. The system of claim 2, wherein at least a portion of the channel exhibits a serpentine shape.

6. The system of claim 1, wherein the cooling fluid is air; and wherein the microcompressor is operative to receive the air from an ambient environment.

7. The system of claim 1, further comprising:

a cooling fluid outlet fluidly communicating with the microexpander and being operative to discharge cooling fluid from the substrate.

8. The system of claim 1, wherein the microcompressor comprises multiple compressor stages formed in the substrate.

9. The system of claim 1, wherein the substrate defines a cooling fluid inlet fluidly communicating with the microcompressor for routing cooling fluid to the microcompressor.

10. The system of claim 9, further comprising:

a cooling fluid outlet fluidly communicating with the microexpander; and wherein the cooling fluid inlet and the cooling fluid outlet fluidly communicate with each other.

11. The system of claim 10, wherein the substrate includes first and second opposing exterior surfaces and a sidewall defining a periphery of the substrate between the first and second opposing exterior surfaces; and wherein the cooling fluid inlet and a cooling fluid outlet are both formed through the sidewall.

12. The system of claim 1, further comprising:

means for providing cooling fluid to the microcompressor.

13. The system of claim 1, further comprising:

a defined volume of cooling fluid; and wherein the substrate is arranged within the defined volume of cooling fluid.

14. The system of claim 13, wherein the cooling fluid is a phase-change material, the cooling fluid being compressed into a liquid by the microcompressor and expanded into a gas by the microexpander.

15. A method for cooling a heat-generating component supported by a substrate, said method comprising:

compressing a cooling fluid within the substrate; and expanding the cooling fluid to remove heat from the heat-generating component.

16. The method of claim 15, further comprising:

receiving the cooling fluid from a defined volume of the cooling fluid within which the heat-generating component and substrate are arranged; and returning the cooling fluid to the defined volume after removing heat from the heat-generating component.

17. The method of claim 15, further comprising:

removing heat from the cooling fluid prior to expanding the cooling fluid.

18. The method of claim 15, wherein expanding the cooling fluid comprises:

channeling the cooling fluid within the substrate to thermally couple the cooling fluid with the heat-generating component.

19. The method of claim 15, wherein the heat-generating component forms at least a portion of an integrated circuit.

20. The method of claim 15, wherein expanding the cooling fluid comprises:

expanding the cooling fluid within the substrate.

* * * * *